(12) United States Patent
Liu et al.

(10) Patent No.: US 11,621,281 B2
(45) Date of Patent: Apr. 4, 2023

(54) DISPLAY SUBSTRATE AND DISPLAY DEVICE

(71) Applicants: Hefei BOE Display Technology Co., Ltd., Anhui (CN); BOE Technology Group Co., Ltd., Beijing (CN)

(72) Inventors: Zexu Liu, Beijing (CN); Jincheng Gao, Beijing (CN); Tao Zhu, Beijing (CN); Zhiqiang Hu, Beijing (CN); Qi Liu, Beijing (CN); Lixing Zhao, Beijing (CN); Liang Chen, Beijing (CN)

(73) Assignees: Hefei BOE Display Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/499,187

(22) Filed: Oct. 12, 2021

(65) Prior Publication Data

US 2022/0130869 A1 Apr. 28, 2022

(30) Foreign Application Priority Data

Oct. 26, 2020 (CN) .......................... 202022413573.0

(51) Int. Cl.
| | |
|---|---|
| H01L 27/12 | (2006.01) |
| G02F 1/1335 | (2006.01) |
| G02F 1/1362 | (2006.01) |
| G02F 1/1343 | (2006.01) |
| G02F 1/1368 | (2006.01) |

(52) U.S. Cl.
CPC ......... *H01L 27/124* (2013.01); *G02F 1/1368* (2013.01); *G02F 1/133512* (2013.01); *G02F 1/134309* (2013.01); *G02F 1/136286* (2013.01); *H01L 27/1288* (2013.01)

(58) Field of Classification Search
None
See application file for complete search history.

(56) References Cited

U.S. PATENT DOCUMENTS

2005/0225708 A1* 10/2005 Oke .................. G02F 1/134363
349/139
2011/0304787 A1* 12/2011 Wang ................ G02F 1/133509
349/33

(Continued)

FOREIGN PATENT DOCUMENTS

JP 03192729 A * 8/1991

*Primary Examiner* — Shan Liu
(74) *Attorney, Agent, or Firm* — IPRO, PLLC

(57) ABSTRACT

A display substrate includes a base substrate; a gate metal pattern including a gate electrode of a thin film transistor and gate lines; a source-drain metal pattern including a source electrode and a drain electrode of the thin film transistor, and data lines, where the gate line cross the data line, to define a plurality of pixel regions arranged in an array form; and a first transparent metal pattern including a common electrode pattern. A minimum distance between each gate line and common electrode patterns in a row of pixel regions located in a same row as the gate line in a first direction is a first spacing, a minimum distance between the gate line and common electrode patterns in the other row of pixel regions adjacent to the gate line in the first direction is a second spacing, and the first spacing is greater than the second spacing.

13 Claims, 2 Drawing Sheets

(56) References Cited

U.S. PATENT DOCUMENTS

| | | | |
|---|---|---|---|
| 2012/0099041 A1* | 4/2012 | Xie | G02F 1/136213 |
| | | | 257/E21.409 |
| 2013/0083280 A1* | 4/2013 | Liu | G02F 1/136286 |
| | | | 445/24 |
| 2013/0148071 A1* | 6/2013 | Chen | G02F 1/134336 |
| | | | 349/143 |
| 2017/0176825 A1* | 6/2017 | Cao | G02F 1/134309 |
| 2017/0269425 A1* | 9/2017 | Nakagawa | G02F 1/136286 |

\* cited by examiner

DISPLAY SUBSTRATE AND DISPLAY DEVICE

CROSS-REFERENCE TO RELATED APPLICATIONS

This application claims priority to Chinese Patent Application No. 202022413573.0 filed in China on Oct. 26, 2020, which is incorporated herein by reference in its entirety.

TECHNICAL FIELD

The present disclosure relates to the field of display technology, and in particular to a display substrate and a display device.

BACKGROUND

Due to people's life changing rapidly and more requirements on image quality of display products, various products having a resolution of 8K and a refresh rate of 120 Hz have come into being. Since the number of pixels in a product having a resolution of 8K is a quarter of the number of pixels in a product having a resolution of 4K which has a same size as the product having the resolution of 8K, the fluctuation of an exposure critical dimension (CD) has a greater effect on a parasitic capacitance and the pixels of the product having the resolution of 8K than that of the product having the resolution of 4K.

SUMMARY

A display substrate is provided in the present disclosure, including: a base substrate; a gate metal pattern arranged on the base substrate and including a gate electrode of a thin film transistor and a plurality of gate lines; a source-drain metal pattern arranged on the base substrate and including a source electrode and a drain electrode of the thin film transistor, and a plurality of data lines, where the gate lines cross the data lines, to define a plurality of pixel regions arranged in an array form; and a first transparent metal pattern arranged on the base substrate and including a common electrode pattern arranged in each pixel region. A minimum distance between each gate line and common electrode patterns in a row of pixel regions located in a same row as the gate line in a first direction perpendicular to the gate line and parallel to the base substrate is a first spacing, a minimum distance between the gate line and common electrode patterns in the other row of pixel regions adjacent to the gate line in the first direction is a second spacing, and the first spacing is greater than the second spacing.

Illustratively, a difference between the first spacing and the second spacing ranges from 1 μm to 3 μm.

Illustratively, the difference between the first spacing and the second spacing is 1 μm or 2 μm.

Illustratively, the first spacing is 9.5 μm, and the second spacing is 7.5 μm.

Illustratively, the gate metal pattern further includes a plurality of common signal lines parallel to the gate line, and an edge of an orthographic projection of each common signal line onto the base substrate coincides with an edge of an orthographic projection of the common electrode pattern, which is connected to the common signal line, onto the base substrate, at a side of the common electrode pattern towards the gate line.

Illustratively, the display substrate further includes a second transparent metal pattern arranged on the base substrate and including a pixel electrode pattern arranged in each pixel region. A minimum distance between each gate line and pixel electrode patterns in the row of pixel regions located in the same row as the gate line in the first direction is a third spacing, a minimum distance between the gate line and pixel electrode patterns in the other row of pixel regions adjacent to the gate line in the first direction is a fourth spacing, and the third spacing is greater than the fourth spacing.

Illustratively, the third spacing is 8.5 μm and the fourth spacing is 4.5 μm.

A display device is further provided in the present disclosure, including: an array substrate, which is the above-mentioned display substrate; and a color film substrate. The color film substrate and the array substrate are arranged opposite to each other to form a cell, the color film substrate includes a black matrix, and an orthographic projection of the black matrix onto the base substrate covers an orthographic projection of the gate line onto the base substrate.

Illustratively, a center line of the orthographic projection of the gate line onto the base substrate in the first direction coincides with a center line of the orthographic projection of the black matrix onto the base substrate in the first direction.

Illustratively, a center line of the orthographic projection of the gate line onto the base substrate in the first direction, relative to a center line of the orthographic projection of the black matrix onto the base substrate in the first direction, is offset by a preset distance towards a side of the common electrode patterns in the other row of pixel regions adjacent to the gate line.

Illustratively, the preset distance is equal to a difference between the first spacing and the second spacing.

A method for manufacturing the above-mentioned display substrate is further provided in the present disclosure, including: providing the base substrate; forming the gate metal pattern by using a first mask on the base substrate provided with the common electrode patterns. The gate metal pattern includes the plurality of gate lines, and a position of the first mask, relative to a first position, is shifted by a first preset distance in a direction away from the common electrode patterns in the row of pixel regions located in the same row as each gate line. A minimum distance between each gate line formed on the base substrate provided with the common electrode pattern by using the first mask located at the first position and the common electrode patterns in the row of pixel regions located in the same row as the gate line in the first direction is equal to a minimum distance between the gate line and the common electrode patterns in the other row of pixel regions adjacent to the gate line in the first direction.

Illustratively, the first preset distance ranges from 1 μm to 3 μm.

Illustratively, the first preset distance is 1 μm or 2 μm.

Illustratively, the method further includes: forming a second transparent metal pattern on a side of the gate line away from the base substrate by using a second mask. The second transparent metal pattern includes a pixel electrode pattern arranged in each pixel region, and a position of the second mask, relative to a second position, is shifted by a second preset distance along a direction from each gate line to the common electrode patterns in the row of pixel regions located in the same row as the gate line. Minimum distances between pixel electrode patterns in two adjacent rows of pixel regions formed by using the second mask located at the second position and the gate line located between the two adjacent rows of pixel regions in the first direction are equal to each other.

Illustratively, the second preset distance is equal to the first preset distance.

DETAILED DESCRIPTION

Figure 1:
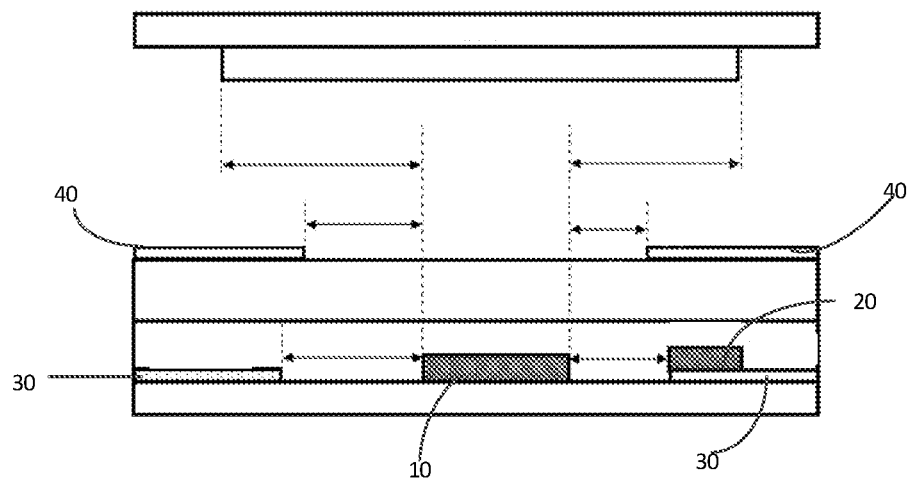
FIG. 1 is a schematic structural diagram of a display device according to an embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be appreciated that, such words as "in the middle of", "on/above", "under/below", "left", "right", "vertical", "horizontal", "inside" and "outside" may be used to indicate directions or positions as viewed in the drawings, and they are merely used to facilitate the description in the present disclosure, rather than to indicate or imply that a device or member must be arranged or operated at a specific position. In addition, such words as "first", "second" and "third" may be merely used to differentiate different components rather than to indicate or imply any importance.

Before the detailed description on the display substrate and the display device in the embodiments of the present disclosure, it is necessary to describe the related art as follows.

In the related art, taking a display product by using an Advanced Super Dimension Switch (ADS) technology as an example, as shown in FIG. 1, the display substrate generally includes a gate line 10, a data line (not shown), a thin film transistor (not shown), a common signal line (Com) 20, a common electrode (1st ITO) 30, and a pixel electrode (2nd ITO) 40. The gate lines 10 cross the data lines, so as to define a plurality of pixel regions arranged in an array form. The common electrode 30 and the pixel electrode 40 are arranged opposite to each other, and located in each pixel region. The gate line 10 is located between two adjacent rows of pixel regions, and connected to thin film transistors in one of the two adjacent rows of the pixel regions, which is hereinafter referred to as a row of pixel regions located in a same row as the gate line, and the other row of the two adjacent rows of pixel regions is referred to as a row of pixel regions adjacent to the gate line. Typically, the gate line is located in the middle of the common electrodes in two adjacent rows of pixel regions, i.e., distances between the gate line and the two adjacent common electrodes (1st ITO) are the same.

In the related art, during an exposure process of a glass base substrate, an exposure amount at a sealing ridge of an exposure machine is different from an exposure amount at another position, as a result, an exposure CD of a corresponding 1st ITO (usually a common electrode) at the sealing ridge changes suddenly, and a size of each 1st ITO in the row of pixel regions is relatively larger than a size of each 1st ITO in other rows of the pixel regions. Therefore, when the gate line (Gate) is charged, coupling capacitances (Cgc) between the gate line and voltages Vcom on the common electrodes in the row of pixel regions located in the same row as the gate line are generally larger, and it is able to pull voltages Vcom' on the common electrodes in other rows of pixel regions, thereby causing the other rows of pixels to have larger brightness values. This phenomenon is referred to as Chuck Mura. When Chuck Mura occurs, it shows that, under a background color with a gray scale value of L127, an Mura defect where a thin and straight black line throughout a long edge of a screen can be clearly seen.

Figure 2:
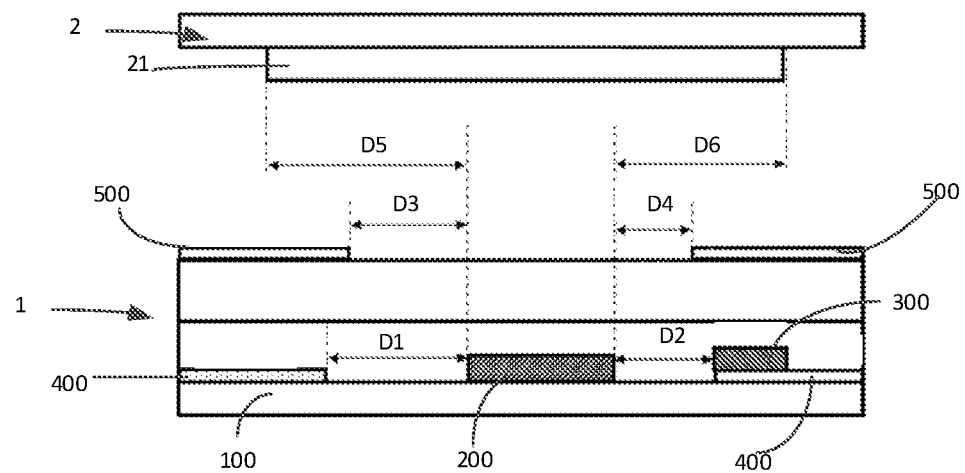
FIG. 2 is another schematic structural diagram of the display panel according to an embodiment of the present disclosure.

FIG. 2 is a schematic structural diagram of a display substrate according to an embodiment of the present disclosure, where only a part of, rather than all of, a structure of the display substrate is shown. For example, an active layer, a source-drain metal pattern of a thin film transistor, etc. are not shown.

Figure 3:
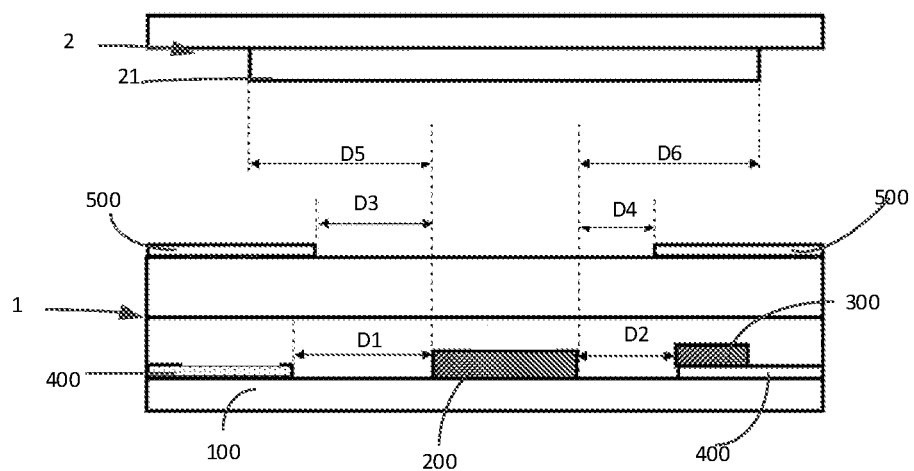
FIG. 3 is yet another schematic structural diagram of the display device according to an embodiment of the present disclosure.

As shown in FIG. 2 and FIG. 3, the display substrate in the embodiment of the present disclosure includes: a base substrate 100; a gate metal pattern (Gate) arranged on a base substrate 100 and including a gate electrode of a thin film transistor and a plurality of gate lines 200; a source-drain metal pattern (not shown) arranged on the base substrate 100 and including a source electrode and a drain electrode of the thin film transistor, and a plurality of data lines, where the gate line 200 cross the data lines, to define a plurality of pixel regions arranged in an array form; and a first transparent metal pattern arranged on the base substrate 100 and including a common electrode pattern 400 (1st ITO) arranged in each pixel region. A minimum distance between each gate line 200 and common electrode patterns 400 in a row of pixel regions located in a same row as the gate line 200 in a first direction perpendicular to the gate line 200 and parallel to the base substrate 100 is a first spacing D1, a minimum distance between the gate line 200 and common electrode patterns 400 in the other row of pixel regions adjacent to the gate line 200 in the first direction is a second spacing D2, and the first spacing D1 is greater than the second spacing D2.

In the above-mentioned scheme, since the Chuck Mura is caused by an increase in the parasitic capacitance Cgc due to sudden change of the CD during the exposure of the 1st ITO, the first spacing D1 between each the gate line 200 in the display substrate in the embodiment of the present disclosure and the common electrode patterns 400 in the row of pixel regions located in the same row as the gate line 200 is greater than the second spacing D2 between the gate line 200 and the common electrode patterns 400 in the other row of pixel regions adjacent to the gate line 200. That is, as compared with that each gate line 200 is located in the middle of the common electrodes in two adjacent rows of pixel regions in the related art, in the embodiment of the present disclosure, each gate line 200 (Gate) is offset relative to the common electrode patterns 400, so that the distance between the gate line 200 and the common electrode patterns 400 (1st ITO) in the row of pixel regions located in the same row as the gate line is increased, while the distance between the gate line 200 and the common electrode patterns 400 in the other row of pixel regions adjacent to the gate line is decreased. Thus, it is able to reduce the parasitic capacitance (Cgc) between the gate line 200 and the common electrode patterns 400 (1ITO) in the row of pixel regions located in the same row as the gate line, mitigate Chuck Mura-like defects and improve the yield of advanced products.

In the display substrate of the embodiments of the present disclosure, it is able to generate a shift between the gate line 200 and the common electrode patterns 400 just by changing the exposure process conditions, instead of using a new mask, thereby reducing a cost of improvement. In addition, there is no need to upgrade related devices, it is able to increase the adaptability of an exposure machine to high-end products, so that the exposure machine can be applied in OLED manufacturing and a production line in which an exposure is performed by using a photoresist (PR) with a mask.

In some embodiments, as shown in FIG. 2, a difference between the first spacing D1 and the second spacing D2 ranges from 1 µm to 3 µm. In the above-mentioned scheme, when the difference d between the first spacing D1 and the second spacing D2 ranges from 1 µm to 3 µm, the effect of mitigating the Chuck Mura-like defect is better. Optionally, the difference d between the first spacing D1 and the second spacing D2 is 1 µm or 2 µm.

In some embodiments, as shown in FIG. 2, the gate metal pattern further includes a plurality of common signal lines 300 parallel to the gate line 200, and an edge of an orthographic projection of each common signal line 300 onto the base substrate 100 coincides with an edge of an orthographic projection of the common electrode pattern 400, which is connected to the common signal line 300, onto the base substrate 100, at a side of the common electrode pattern 400 towards the gate line 200.

In addition, in some embodiments, as shown in FIG. 2, the display substrate further includes a second transparent metal pattern arranged on the base substrate 100 and including a pixel electrode pattern 500 (2nd ITO) arranged in each pixel region, a minimum distance between each gate line 200 and pixel electrode patterns 500 in the same row of pixel regions in the first direction is a third spacing D3, a minimum distance in the first direction between the gate line 200 and pixel electrode patterns 500 in the other row of pixel regions adjacent to the gate line 200 in the first direction is a fourth spacing, and the third spacing D3 is greater than the fourth spacing D4.

With the above-mentioned scheme, the gate line 200 is offset relative to the common electrode patterns 400, and the positions of the pixel electrode patterns 500 relative to the common electrode patterns 400 remain unchanged, as a result, the gate line 200 is located between the pixel electrode patterns 500 in two adjacent rows of pixel regions, and the distance between the gate line 200 and the pixel electrode patterns in the row of pixel regions located in the same row as the gate line is increased.

In one exemplary embodiment, as shown in FIG. 2, the first spacing D1 is 9.5 µm, the second spacing D2 is 7.5 µm, the third spacing D3 is 8.5 µm, and the fourth spacing D4 is 4.5 µm.

It should be appreciated that the above is for illustrative purposes only, and, in practical applications, specific values of the first spacing D1, the second spacing D2, the third spacing D3 and the fourth spacing D4 are not limited thereto.

A method for manufacturing the above-mentioned display substrate is further provided in the embodiments of the present disclosure, including: providing the base substrate; forming the common electrode pattern in each pixel region on the base substrate; forming the gate metal pattern by using a first mask on the base substrate on which the common electrode pattern has been formed. The gate metal pattern includes the plurality of gate lines, and a position of the first mask, relative to a first position, is shifted by a first preset distance in a direction away from the common electrode patterns in the row of pixel regions located in the same row as the gate line. A minimum distance between each gate line formed on the base substrate on which the common electrode pattern has been formed by using the first mask located at the first position and the common electrode patterns in the row of pixel regions located in the same row as the gate line in the first direction is equal to a minimum distance between the gate line and the common electrode patterns in the other row of pixel regions adjacent to the gate line in the first direction.

In some embodiments, the first preset distance ranges from 1 µm to 3 µm.

In some embodiments, the first preset distance is 1 µm or 2 µm.

In some embodiments, the method further includes: forming a second transparent metal pattern on a side of the gate line away from the base substrate by using a second mask. The second transparent metal pattern includes a pixel electrode pattern arranged in each pixel region, and a position of the second mask, relative to a second position, is shifted by a second preset distance along a direction from each gate line to the common electrode patterns in the row of pixel regions located in the same row as the gate line. Minimum distances between pixel electrode patterns in two adjacent rows of pixel regions formed by using the second mask located at the second position and the gate line located between the two adjacent rows of pixel regions in the first direction are equal to each other.

In some embodiments, the second preset distance is equal to the first preset distance.

The manufacturing process of the display substrate of the present disclosure is described in more detail below, so as to facilitate a further understanding of the present disclosure.

In some embodiments, the display substrate may be formed through the following processes.

Step S01, on the base substrate 100 of the display substrate, a patterning process of a 1st ITO layer is normally finished by using an etching process in the related art. For example, processes of film forming, exposure, etching and PR stripping are successively performed on the 1st ITO layer, so as to form the common electrode pattern 400.

Step S02, a gate metal layer (Gate layer) is formed on the base substrate 100, and patterns such as the gate lines 200 and the common signal lines 300 are formed by using an etching process. During an exposure process of the gate metal layer, as compared with a first mask in the related art, a second mask in the embodiments of the present disclosure is shifted relative to the 1st ITO layer, where a shift amount is the difference d between the first spacing D1 and the second spacing D2, and a shift direction is the direction away from the common electrode patterns 400 in the row of pixel regions located in the same row as the gate line that each gate line 200 is offset in. The remaining processes are unchanged, so as to form the patterns such as the gate lines 200 and the common signal lines 300. In some embodiments, the second mask is the same as the first mask. For example, sizes of openings thereof are the same.

Step S03, an active layer (ACT layer), a source-drain metal pattern (SD layer), a passivation layer (PVX layer), a pixel electrode layer (2st ITO layer) and the like are formed. The ACT layer is exposed through the following steps. As compared with a third mask in the relevant art, a fourth mask in the embodiments of the present disclosure is shifted relative to the Gate layer, where a shift amount is the difference d between the first spacing D1 and the second spacing D2, and a shift direction is a direction approaching the common electrode patterns 400 in the row of pixel regions located in the same row as the gate line that each gate line is offset in. The remaining processes are unchanged, so as to form the active layer. In some embodiments, the fourth mask is the same as the third mask. For example, sizes of openings thereof are the same. The SD layer is exposed through the following steps. With reference to the exposure process of the ACT layer, as compared with a fifth mask in the related art, a sixth mask in the embodiments of the present disclosure is shifted relative to the Gate layer, where a shift amount is the difference d between the first spacing D1 and the second spacing D2, and a shift direction is the direction approaching the common electrode patterns 400 in the row of pixel regions located in the same row as the gate line that each gate line is offset in. The remaining processes are unchanged, so as to form the source-drain metal pattern. The PVX layer and 2ITO layer are exposed with reference to the SD layer in an aligned manner.

It can be seen therefrom that in the above-mentioned embodiments, the patterning process of the 1st ITO is the same as that in the related art and remains unchanged, only masks in the exposure process of the Gate layer, the ACT layer, the SD layer, the PVX layer and the 2ITO layer are shifted relative to each other, and there is no need to use new masks, thereby reducing the cost of improvement.

In other embodiments, the display substrate may be formed through the following processes.

Step S11, a pattern of the 1st ITO layer is formed on the base substrate 100 of the display substrate by using an etching process. Specifically, a film of the 1st ITO layer is normally finished by using a film forming process in the relevant art first. Next, during an exposure process, as compared with a first mask in the relevant art, a second mask in the embodiments of the present disclosure is appropriately shifted relative to the base substrate 100. An optional shift scheme is as follows. A shift amount is a, and a is less than the difference d between the first spacing D1 and the second spacing D2. A shift direction is the direction away from the common electrode patterns 400 in the row of pixel regions located in the same row as the gate line that each gate line 200 is offset in. The remaining processes are unchanged, so as to form the common electrode patterns 400. The second mask is the same as the first mask. For example, sizes of openings thereof are the same. A center position of the common electrode pattern 400 formed on the base substrate by using the first mask coincides with a center position of the base substrate.

Step S21, a gate metal layer (Gate layer) is formed on the base substrate 100, and patterns such as the gate lines 200 and the common signal lines 300 are formed by using an etching process. During an exposure process of the gate metal layer, as compared with a third mask in the related art, a fourth mask in the embodiments of the present disclosure is appropriately shifted relative to the 1st ITO layer. An optional shift scheme is as follows. in the direction away from the common electrode patterns 400 in the row of pixel regions located in the same row as the gate line, a shift amount is b, where b is equal to the difference d between the first spacing D1 and the second spacing D2 minus a. The remaining processes are unchanged.

Step S03, an active layer (ACT layer), a source-drain metal pattern (SD layer), a passivation layer (PVX layer), a pixel electrode layer (2st ITO layer) and the like are formed.

The ACT layer is exposed through the following steps. As compared with a fifth mask in the relevant art, a sixth mask in the embodiments of the present disclosure is shifted relative to the Gate layer, where a shift amount is the difference d between the first spacing D1 and the second spacing D2, and a shift direction is the direction approaching the common electrode patterns 400 in the row of pixel regions located in the same row as the gate line. The remaining processes are unchanged. The SD layer is exposed through the following steps. With reference to the exposure process of the ACT layer, as compared with a seventh mask in the related art, an eighth mask in the embodiments of the present disclosure is shifted relative to the Gate layer, where a shift amount is the difference d between the first spacing D1 and the second spacing D2, and a shift direction is the direction approaching the common electrode patterns 400 in the row of pixel regions located in the same row as the gate line. The remaining processes are unchanged, so as to form the source-drain metal patterns. The PVX layer and 2ITO layer are exposed with reference to the SD layer for exposure in an aligned manner.

Taking a 65-inch product having a resolution of 8K as an example, the display substrate in the embodiments of the present disclosure is compared with a display substrate in the related art, and pixel improvement results of the display substrate in the embodiments of the present disclosure are shown in Table 1.

TABLE 1

| Chuck Mura Level | the display substrate in the embodiment of the present disclosure | the display substrate in the related art |
| --- | --- | --- |
| L0 | 57.1% | 0% |
| L1 | 28.6% | 57.1% |
| L2 | 14.3% | 42.9% |
| Cgc(fF) | 1.53 | 1.40 |

The more serious the Chuck Mura phenomenon is, the higher the level is. It can be obtained from the Table 1 that the coupling capacitance Cgc of the display substrate in the embodiment of present disclosure is reduced, the Chuck Mura is mostly at the L0-L1 level, and the improvement effect is evident.

In addition, the display device is further provided in the present disclosure, including: an array substrate 1, which is the display substrate of the embodiment of the present disclosure; and a color film substrate 2. The color film substrate 2 and the array substrate 1 are arranged opposite to each other to form a cell, the color film substrate 2 includes a black matrix 21, and an orthographic projection of the black matrix 21 onto the base substrate 100 covers an orthographic projection of the gate line 200 onto the base substrate 100.

The display device may be any product or component having a display function, such as a liquid crystal television, a liquid crystal display, a digital photo frame, a mobile phone, a tablet computer, etc. The display device further includes a flexible circuit board, a printed circuit board and a backplane.

In some embodiments, in the case that the array substrate 1 is the display substrate as shown in FIG. 2, a center line of the orthographic projection of the gate line 200 onto the base substrate 100 in the first direction coincides with a center line of the orthographic projection of the black matrix 21 onto the base substrate 100 in the first direction.

In other embodiments, in the case that the array substrate 1 is the display substrate as shown in FIG. 1, a center line of the orthographic projection of the gate line 200 onto the base substrate 100 in the first direction, relative to a center line of the orthographic projection of the black matrix onto the base substrate in the first direction, is offset by a preset distance towards a side of the common electrode patterns in the other row of pixel regions adjacent to the gate line. The preset distance is equal to the difference d between the first spacing D1 and the second spacing D2.

Some descriptions will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are merely for illustrative purposes, but shall not be construed as limiting the scope of the present disclosure. The scope of the present disclosure shall be subject to the scope defined by the appended claims.

What is claimed is:

1. A display substrate, comprising:
    a base substrate;
    a gate metal pattern arranged on the base substrate and comprising a gate electrode of a thin film transistor and a plurality of gate lines;
    a source-drain metal pattern arranged on the base substrate and comprising a source electrode and a drain electrode of the thin film transistor, and a plurality of data lines, wherein the gate lines cross the data lines, to define a plurality of pixel regions arranged in an array form; and
    a first transparent metal pattern arranged on the base substrate and comprising a common electrode pattern arranged in each pixel region,
    wherein a minimum distance between each gate line and common electrode patterns in a row of pixel regions located in a same row as the gate line in a first direction perpendicular to the gate line and parallel to the base substrate is a first spacing, a minimum distance between the gate line and common electrode patterns in the other row of pixel regions adjacent to the gate line in the first direction is a second spacing, and the first spacing is greater than the second spacing; and
    the first spacing is 9.5 μm, and the second spacing is 7.5 μm.

2. The display substrate according to claim 1, wherein the gate metal pattern further comprises a plurality of common signal lines parallel to the gate line, and an edge of an orthographic projection of each common signal line onto the base substrate coincides with an edge of an orthographic projection of the common electrode pattern, which is connected to the common signal line, onto the base substrate, at a side of the common electrode pattern towards the gate line.

3. The display substrate according to claim 1, further comprising: a second transparent metal pattern arranged on the base substrate and comprising a pixel electrode pattern arranged in each pixel region, wherein a minimum distance between each gate line and pixel electrode patterns in the row of pixel regions located in the same row as the gate line in the first direction is a third spacing, a minimum distance between the gate line and pixel electrode patterns in the other row of pixel regions adjacent to the gate line in the first direction is a fourth spacing, and the third spacing is greater than the fourth spacing.

4. The display substrate according to claim 3, wherein the third spacing is 8.5 μm, and the fourth spacing is 4.5 μm.

5. A display device, comprising:
    an array substrate, which is the display substrate according to claim 1; and
    a color film substrate, wherein the color film substrate and the array substrate are arranged opposite to each other to form a cell, the color film substrate comprises a black matrix, and an orthographic projection of the black matrix onto the base substrate covers an orthographic projection of the gate line onto the base substrate.

6. The display device according to claim 5, wherein a center line of the orthographic projection of the gate line onto the base substrate in the first direction coincides with a center line of the orthographic projection of the black matrix onto the base substrate in the first direction.

7. The display device according to claim 5, wherein
    a center line of the orthographic projection of the gate line onto the base substrate in the first direction, relative to a center line of the orthographic projection of the black matrix onto the base substrate in the first direction, is offset by a preset distance towards a side of the common electrode patterns in the other row of pixel regions adjacent to the gate line.

8. The display device according to claim 7, wherein the preset distance is equal to a difference between the first spacing and the second spacing.

9. The display device according to claim 7, wherein the gate metal pattern further comprises a plurality of common signal lines parallel to the gate line, and an edge of an orthographic projection of each common signal line onto the base substrate coincides with an edge of an orthographic projection of the common electrode pattern, which is connected to the common signal line, onto the base substrate, at a side of the common electrode pattern towards the gate line.

10. The display device according to claim 7, wherein the display substrate further comprises: a second transparent metal pattern arranged on the base substrate and comprising a pixel electrode pattern arranged in each pixel region, wherein a minimum distance between each gate line and pixel electrode patterns in the row of pixel regions located in the same row as the gate line in the first direction is a third spacing, a minimum distance between the gate line and pixel electrode patterns in the other row of pixel regions adjacent to the gate line in the first direction is a fourth spacing, and the third spacing is greater than the fourth spacing.

11. A method for manufacturing the display substrate according to claim 1, comprising:
    providing the base substrate;
    forming the common electrode pattern in each pixel region on the base substrate; and
    forming the gate metal pattern by using a first mask on the base substrate provided with the common electrode patterns, wherein the gate metal pattern comprises a plurality of gate lines, and a position of the first mask, relative to a first position, is shifted by a first preset distance in a direction away from the common electrode patterns in the row of pixel regions located in the same row as each gate line, wherein a minimum distance between each gate line formed on the base substrate provided with the common electrode patterns by using the first mask located at the first position and the common electrode patterns in the row of pixel regions located in the same row as the gate line in the first direction is equal to a minimum distance between the gate line and the common electrode patterns in the other row of pixel regions adjacent to the gate line in the first direction.

12. The method according to claim 11, further comprising:
forming a second transparent metal pattern on a side of the gate line away from the base substrate by using a second mask, wherein the second transparent metal pattern comprises a pixel electrode pattern arranged in each pixel region, and a position of the second mask is shifted by a second preset distance relative to a second position along a direction from each gate line to the common electrode patterns in the row of pixel regions located in the same row as the gate line,
wherein minimum distances between pixel electrode patterns in two adjacent rows of pixel regions formed by using the second mask located at the second position and the gate line located between the two adjacent rows of pixel regions in the first direction are equal to each other.

13. The method according to claim 12, wherein the second preset distance is equal to the first preset distance.

\* \* \* \* \*